United States Patent
Celii et al.

(10) Patent No.: US 6,872,665 B1
(45) Date of Patent: Mar. 29, 2005

(54) PROCESS FLOW FOR DUAL DAMESCENE INTERCONNECT STRUCTURES

(75) Inventors: Francis G. Celii, Dallas, TX (US);
Guoqiang Xing, Plano, TX (US);
Andrew McKerrow, Dallas, TX (US);
Andrew Ralston, Richardson, TX (US);
Zhicheng Tang, Plano, TX (US);
Kenneth J. Newton, McKinney, TX (US); Robert Kraft, Plano, TX (US);
Jeff West, San Antonio, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/599,718

(22) Filed: Jun. 22, 2000

Related U.S. Application Data

(60) Provisional application No. 60/143,282, filed on Jul. 12, 1999.

(51) Int. Cl.$^7$ ............................................. H01L 21/20
(52) U.S. Cl. ..................... 438/700; 438/724; 438/722; 438/725; 438/745; 438/757
(58) Field of Search ........................ 438/700, 724, 438/722, 725, 745, 757, 623, 672

(56) References Cited

U.S. PATENT DOCUMENTS

| | | | | |
|---|---|---|---|---|
| 5,858,870 A | * | 1/1999 | Zheng et al. | 438/622 |
| 6,019,906 A | * | 2/2000 | Jang et al. | 216/2 |
| 6,057,239 A | * | 5/2000 | Wang et al. | 438/745 |
| 6,060,380 A | * | 5/2000 | Subramanian et al. | 438/618 |
| 6,140,226 A | * | 10/2000 | Grill et al. | 438/637 |
| 6,156,643 A | * | 12/2000 | Chan et al. | 438/638 |
| 6,211,061 B1 | * | 4/2001 | Chen et al. | 438/622 |
| 6,235,633 B1 | * | 5/2001 | Jang | 438/675 |
| 6,245,669 B1 | * | 6/2001 | Fu et al. | 438/636 |
| 6,319,822 B1 | * | 11/2001 | Chen et al. | 438/637 |
| 6,329,117 B1 | * | 12/2001 | Padmanaban et al. | 430/270.1 |
| 6,380,096 B2 | * | 4/2002 | Hung et al. | 438/724 |

\* cited by examiner

*Primary Examiner*—Robert Kunemund
(74) *Attorney, Agent, or Firm*—Jacqueline J. Garner; W. James Brady, III; Frederick J. Telecky, Jr.

(57) ABSTRACT

A dual damascene process flow for forming interconnect lines and vias in which at least part of the via (116) is etched prior to the trench etch. A low-k material such as a thermoset organic polymer is used for the ILD (106) and IMD (110). After the at least partial via etch, a BARC (120) is deposited over the structure including in the via (116). Then, the trench (126) is patterned and etched. Although at least some of the BARC (120) material is removed during the trench etch, the bottom of the via (116) is protected.

8 Claims, 6 Drawing Sheets

PROCESS FLOW FOR DUAL DAMESCENE INTERCONNECT STRUCTURES

This application claims priority under 35 USC § 119(e)(1) of provisional application No. 60/143,282 filed Jul. 12, 1999.

FIELD OF THE INVENTION

The invention is generally related to the field of forming interconnect structures in a semiconductor device- and more specifically to a dual damascene process flow for forming interconnect structures.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a damascene process, the IMD is formed first. The IMD is then patterned and etched to form a trench for the interconnect line. If connection vias have not already been formed, a dual damascene process may be used. In a dual damascene process, after the trench is formed in the IMD, a via is etched in the ILD for connection to lower interconnect levels. The barrier layer 14 and a copper seed layer are then deposited over the structure. The barrier layer 14 is typically tantalum nitride or some other binary transition metal nitride. The copper layer is the formed using the seed layer over the entire structure. The copper is then chemically-mechanically polished (CMP'd) to remove the copper from over the IMD 16, leaving copper interconnect lines 18 and vias 20 as shown in FIG. 1. A metal etch is thereby avoided.

Further improvements in interconnect performance are desired. Accordingly, efforts are being made to include low-k dielectric materials in a copper interconnect structure.

SUMMARY OF THE INVENTION

The invention is a dual damascene process flow for forming interconnect lines and vias in which at least part of the via is etched prior to the trench etch. A low-k material such as a thermoset organic polymer is used for the ILD. The IMD may comprise the same material, another low-k material, or a slightly higher-k material. After the at least partial via etch, a BARC is deposited over the structure including in the via. Then, the trench is patterned and etched. Although at least some of the BARC material is removed during the trench etch, the bottom of the via is protected.

An advantage of the invention is providing a dual damascene process flow compatible with a low-k material.

This and other advantages will be apparent to those of ordinary skill in the art having reference to the specification in conjunction with the drawings.

DETAILED DESCRIPTION OF THE EMBODIMENTS

Figure 1:
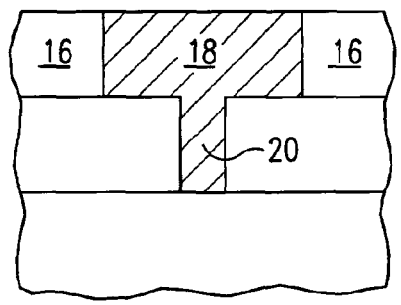
FIG. 1 is a cross-sectional diagram of a prior art dual damascene interconnect structure.

The invention will now be described in conjunction with a copper interconnect/thermoset organic polymer dielectric dual damascene process flow. It will be apparent to those of ordinary skill in the art that the benefits of the invention are applicable to other dual damascene process flows including those for metals other than copper and dielectrics other than thermoset organic polymers.

A first embodiment of the invention is described in conjunction with FIGS. 2A–2K. A semiconductor body 100 is processed through the formation of a first interconnect level 102. First interconnect level 102 may in fact be Metal 1 or it may be any metal interconnect level other than the upper most interconnect layer. A passivation layer 104 is formed over first interconnect level 102. In the preferred embodiment passivation layer 104 comprises silicon nitride. Alternative materials for passivation layer 104 include, but are not limited to, SiC or variants with SiN, such as SIN:C. For example, BloK™ from Applied Materials may be used.

ILD 106 is deposited over passivation layer 104. ILD 106 preferably comprises a low-k material such as an organic polymer. In the preferred embodiment, ILD 106 comprises SiLK™. SiLK™ is a thermoset organic polymer manufactured by Dow Chemical Company. SiLK™ has attractive materials properties for IMD/ILD applications, including a dielectric constant of k=2.65, as measured by MOS capacitors, high thermal stability (Td>450° C.), and a glass transition temperature that is at or above the maximum SiLK™ curing temperature. SiLK™ includes aromatic functional groups and oxygen atoms. Characterization of SiLK™ films by FT-IR spectroscopy does not reveal highly polarizable functionalities such as carbonyl groups.

If SiLK™ is used, it may be deposited by spin coating and furnace annealing. A thickness nonuniformity of less than 5% (1σ). To improve the adhesion of SiLK™ to silicon dioxide and silicon nitride, an adhesion promoter may be spun-on the wafer prior to SiLK™ deposition. The adhesion promoter may be comprised of silicon, oxygen, carbon, and hydrogen atoms. The adhesion promoter may have a thickness on the order of 100 Å.

A shelf layer 108 is formed over ILD 106 followed by deposition of IMD 110. The composition of shelf layer 108 is such that IMD 110 may be etched selectively with respect to shelf layer 108. A selectivity on the order of 20:1 or greater is desirable. IMD 110 may also comprise a low-k material such as an organic polymer. Alternatively, IMD 110 may comprise a slightly higher-k dielectric material (higher than ILD 106 but still less than or equal to that of silicon dioxide). In the preferred embodiment, IMD 110 comprises SiLK™. If SiLK™ is used for IMD 110 and ILD 106, silicon dioxide may be used for shelf layer 108.

In order to pattern and etch a via, a hardmask 112 is formed over IMD 110. Then, a via pattern 114 is formed over hardmask 112. Via pattern 114 typically comprises a resist material. The thickness desired depends on the thickness of ILD 106, IMD 110 and the various etch selectivities. For example, the thickness may be on the order of 6600 Å for a ILD thickness of 3900 Å, a hardmask thickness of 1550 Å and a IMD thickness of 3900 Å.

Figure 2A:
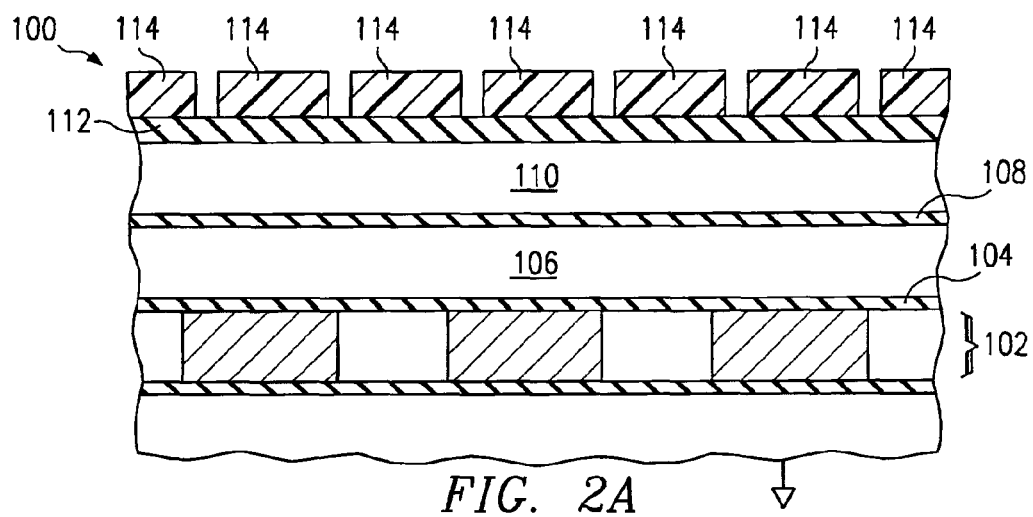
FIGS. 2A–2K are cross-sectional diagrams of a dual damascene process flow according to a first embodiment of the invention.
Figure 2B:
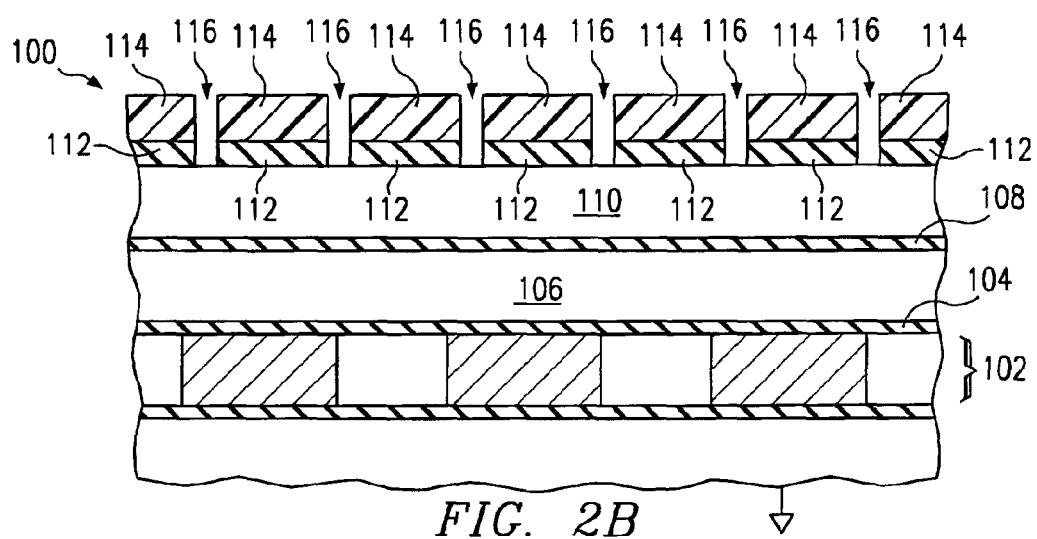

Next, the hardmask 112 is opened in the areas exposed by via pattern 114, as shown in FIG. 2B. An etch chemistry with good selectivity between the hardmask 112 and both the resist pattern 112 and the IMD 110 material is desired. For example, a $Ar/CF_4/O_2/C_2H_4/N_2$ chemistry may be used.

Figure 2C:
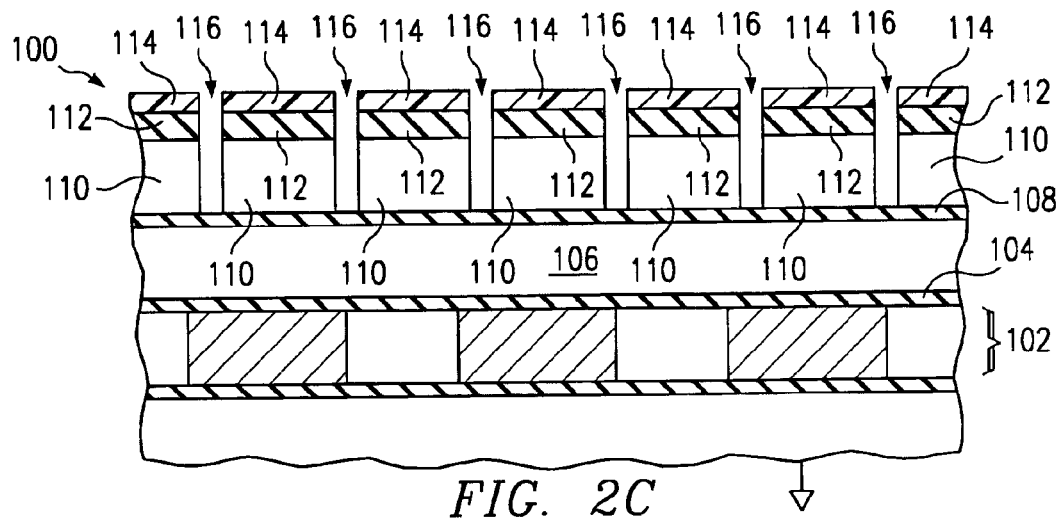

Referring to FIG. 2C, a partial via 116 is etched through IMD 110. If SiLK™ is used, the etch chemistry can comprise $N_2/C_2H_4/O_2$. At least approximately 1:1 selectivity between the resist pattern 112 and IMD 110 material is desired. 2:1 or greater is preferred.

Figure 2D:
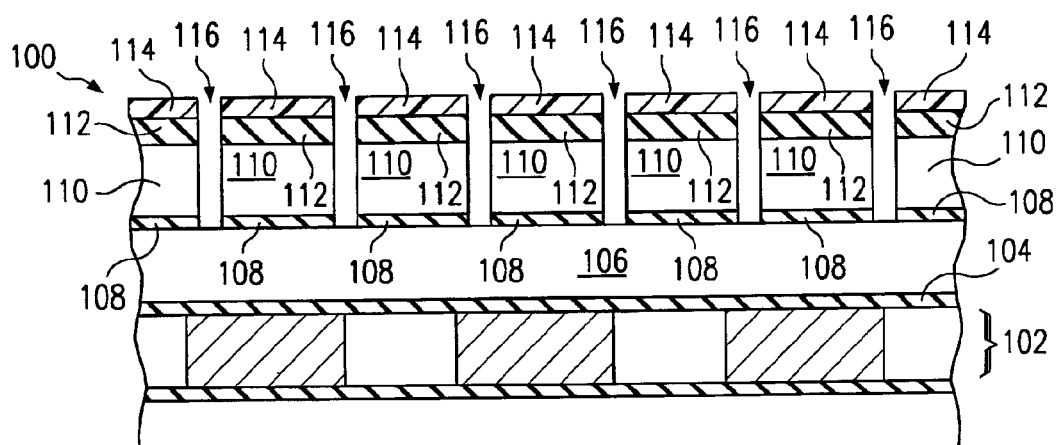
Figure 2E:
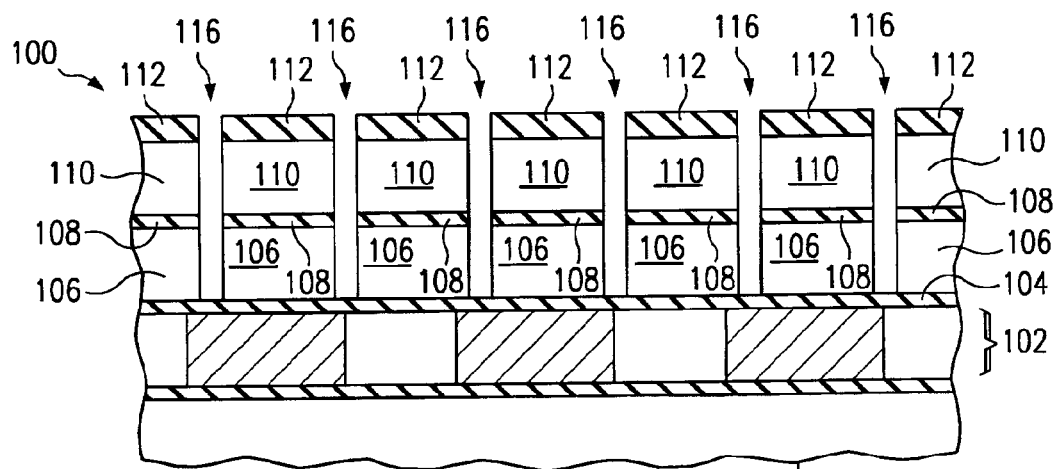

The shelf layer 108 is then opened in via 116 as shown in FIG. 2D. An $Ar/CF_4/O_2/C_2H_4/N_2$ etch chemistry may be used for this etch. Finally, the via 116 is etched through ILD 106, as shown in FIG. 2E. For this etch, a good selectivity between the ILD 106 material and both passivation layer 102 and hardmask 112 is desired. Selectivity against etching hardmask 112 is desired because at this point most and maybe all of the resist pattern 112 may have been removed. Accordingly, a $N_2/O_2/C_2H_4$, (where HC is a hydrocarbon) etch chemistry may be used.

Figure 2F:
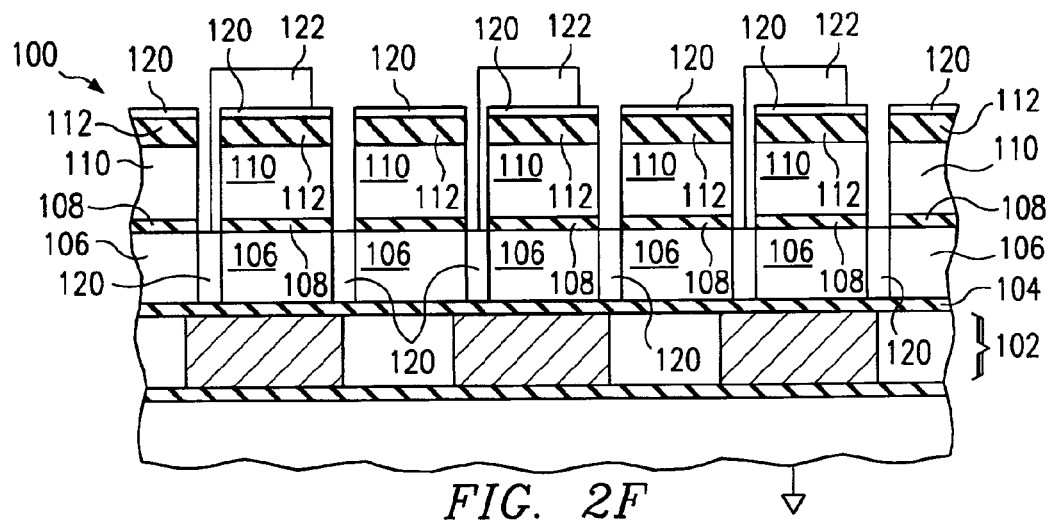

Referring to FIG. 2F, a layer of BARC (bottom antireflective coating) 120 is deposited over the structure, including in vias 116. A trench pattern 112 is then formed. FIG. 2F shows a slight mis-alignment of trench pattern 112 to illustrate the invention's tolerance for mis-alignment errors. BARC layer 120 comprises a material compatible with photolithography for forming trench pattern 112 and that preferably etches somewhat slower than the low-k material of ILD. 106 and etches significantly faster during the subsequent trench etch than passivation layer 104. BARC layer 120 has a thickness on the order of 800 Å over IMD 110. The thickness of BARC layer 120 within via 116 is significantly thicker. The thickness of BARC layer 120 is determined by etch selectivities, via aspect ratio, and ILD 106 thickness. It is desired to have some portion of the BARC layer 120 remain in via 116 after the subsequent trench etch. The portion of BARC layer 120 within via 116 must withstand the subsequent BARC etch, hardmask etch, and IMD etch.

Figure 2G:
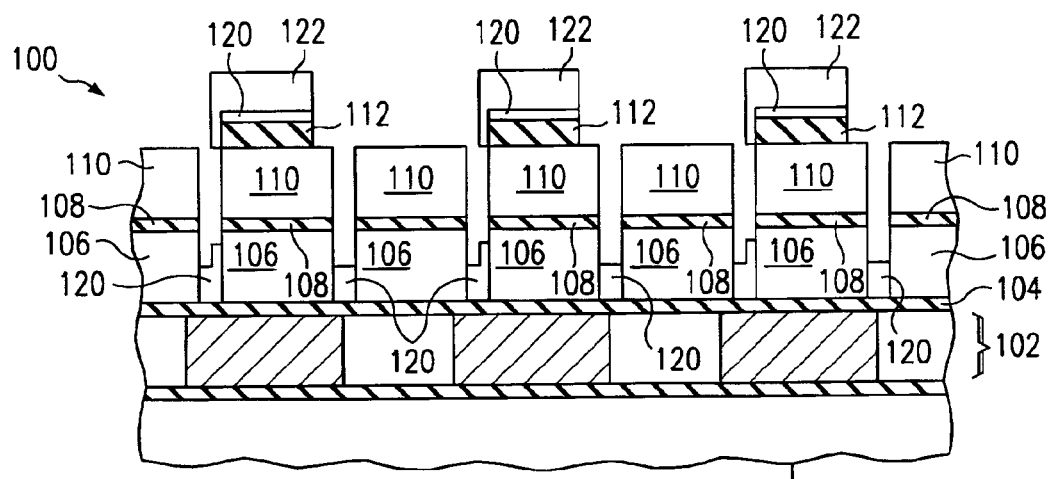

Referring to FIG. 2G, the BARC layer 120 and hardmask 112 are etched using pattern 122. As an example, a gas chemistry of $Ar/O_2$ may be used for the BARC layer 120 and a $Ar/CO/CF_4/C_4F_8$ etch chemistry may be used to open the hardmask.

Figure 2H:
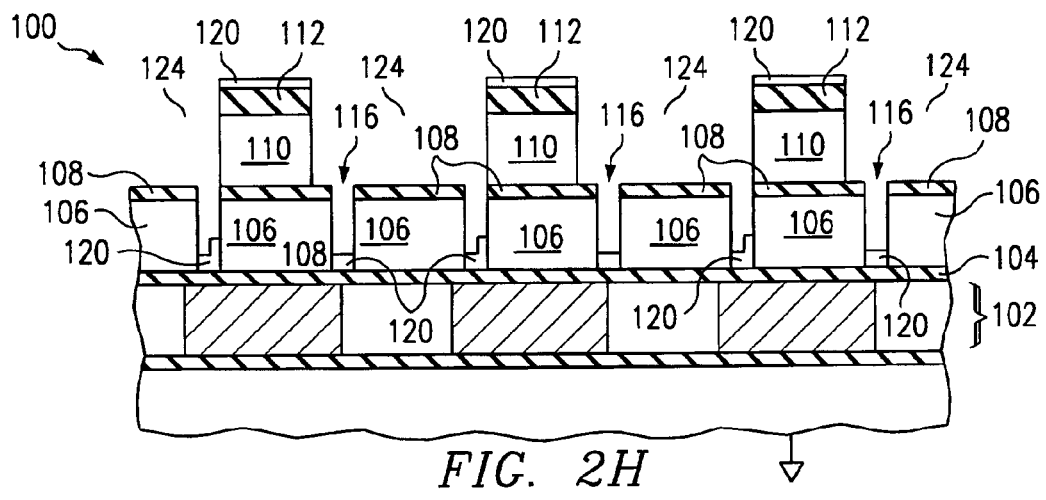

Referring to FIG. 2H, a trench 124 is etched in IMD 110. A $N_2/O_2/C_2H_4$ chemistry may be used. BARC 120 protects the bottom of via 116 during this etch. The trench etch has a selectivity of approximately 30:1 between the IMD 110 and the passivation layer 104. Passivation layer 104 cannot withstand the entire trench etch process. However, if all BARC material is removed during the trench etch, passivation layer 104 offers some limited protection of the bottom of the via 116.

Figure 2I:
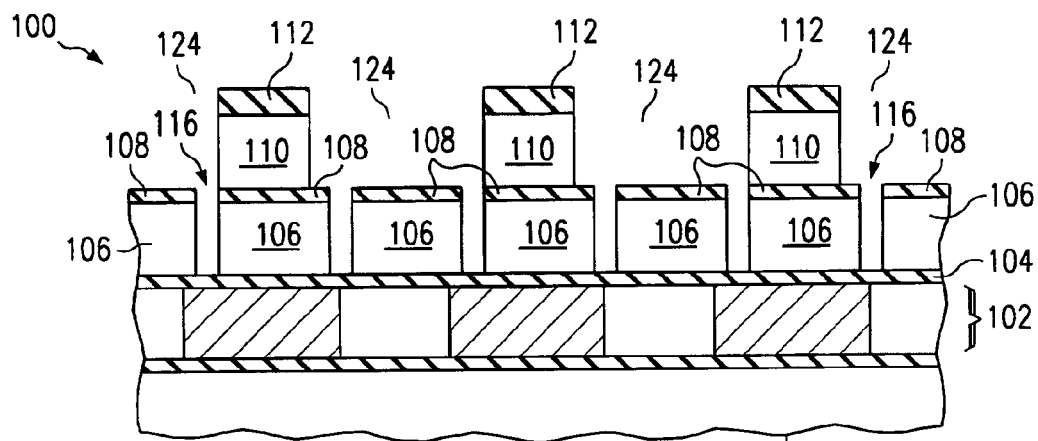
Figure 2J:
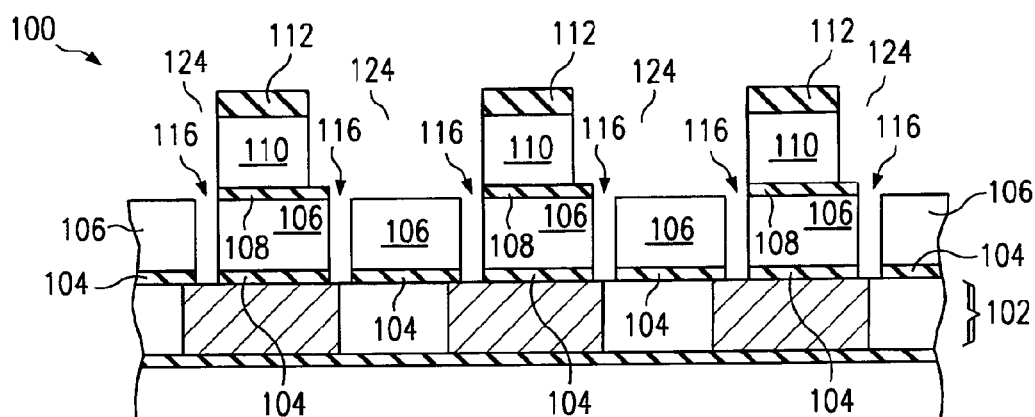

Preferably, after the trench etch, some BARC material remains with in via 116 protecting the bottom of via 116. The remaining BARC material 120 is removed as shown in FIG. 2I. Then, passivation layer 104 is etched at the bottom of via 116 exposing a portion of the metal in interconnect layer 102.

Figure 2K:
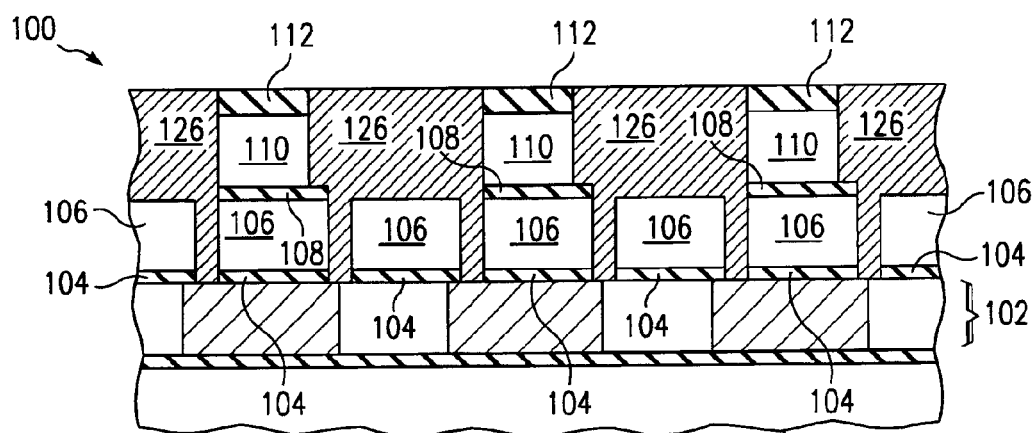

Finally, the desired barrier layers and copper fill are formed and CMP'd back to form second interconnect layer 126, as shown in FIG. 2K. For example, a TaN barrier may be deposited in trench 124 and via 116 followed by a copper seed layer. Using an electroplating process, the copper fill layer is formed. Then, the copper is chemically-mechanically polished until it is planar with the top of IMD 110 or hardmask 112. The above process may then be repeated to form additional metal interconnect layers.

Figure 3A:
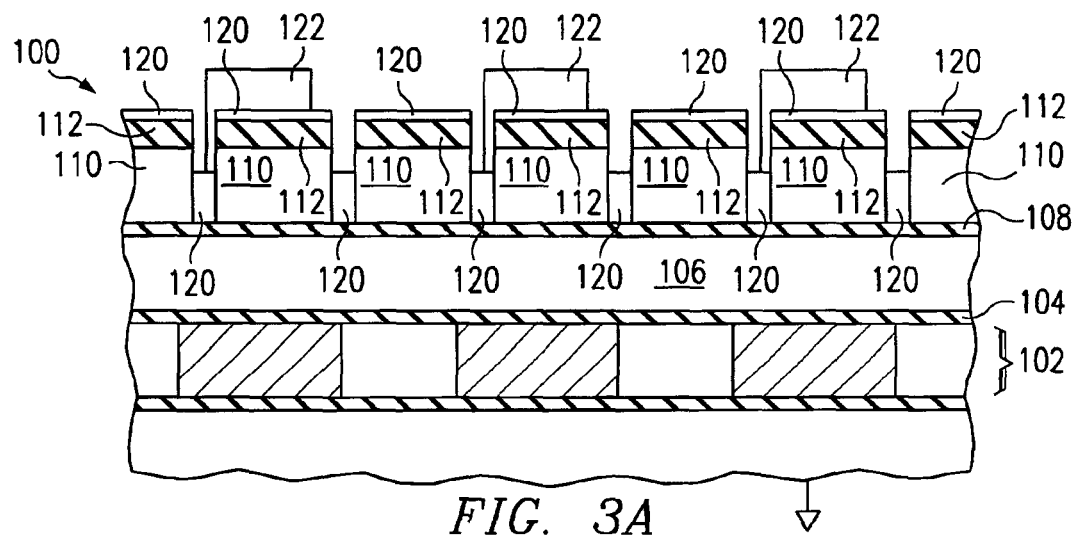
FIGS. 3A–3B are cross-sectional diagrams of a dual damascene process flow according to a second embodiment of the invention.
Figure 3B:
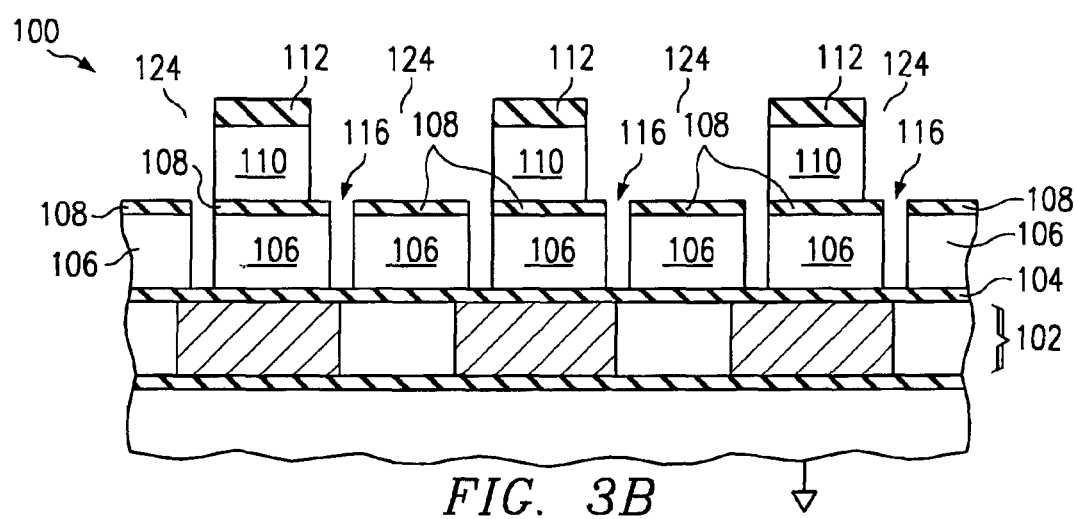

A second embodiment of the invention is described in conjunction with FIGS. 3A–3B. Semiconductor body 100 is processed as in the first embodiment through the partial via etch shown in FIG. 2C. This approach is a half-via first approach. After half the via 116 is etched (e.g., through the IMD 110), the BARC layer 120 is deposited and the trench pattern 122 is formed, as shown in FIG. 3A. The hardmask 112 may be etched using a $Ar/CF_4/O_2/C_2H_4/N_2$ chemistry and the via 116 in SiLK™ IMD 110 may be etched using a $N_2/O_2/HC$ chemistry.

With trench pattern 122 in place, the shelf oxide 108 is opened up. The etch chemistry will also remove any BARC 120 material in via 116 prior to opening up the shelf oxide 108.

Next, the trench 124 is etched in IMD 110. Because, the shelf layer 108 was previously removed in via 116, portions of ILD 106 are exposed to this etch. Thus, via 116 is extended through ILD 106, as shown in FIG. 3B. The desired barrier and copper material are then deposited and CMP'd to form second interconnect layer 126 as shown in FIG. 2K.

Figure 4A:
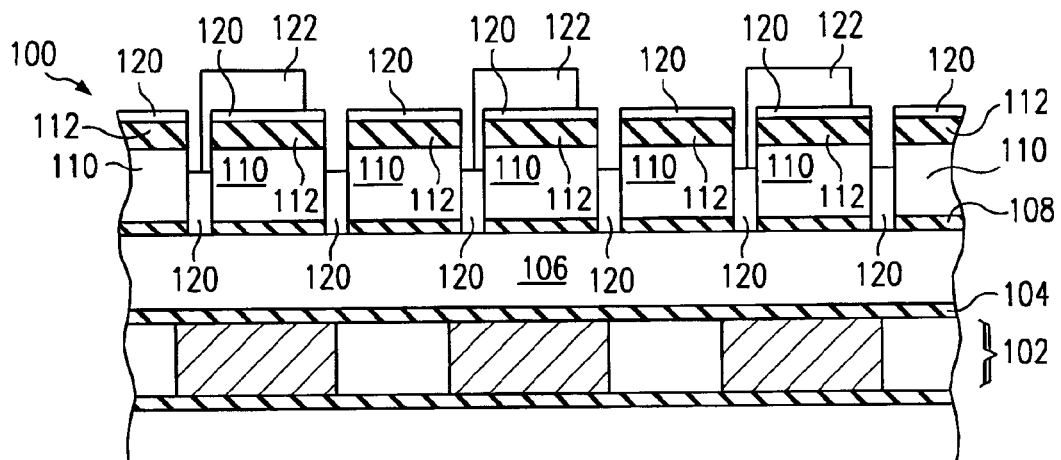
FIGS. 4A–4B are cross-sectional diagrams of a dual damascene process flow according to a third embodiment of the invention.
Figure 4B:
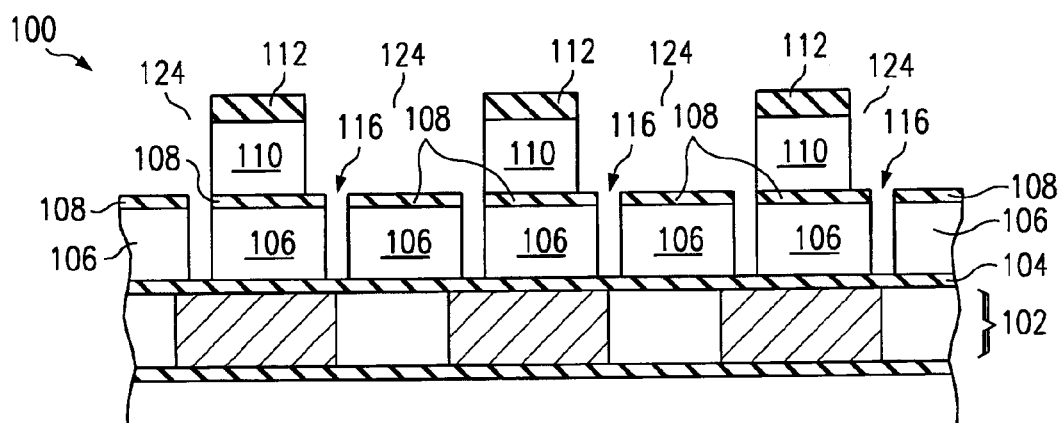
Figure 5:
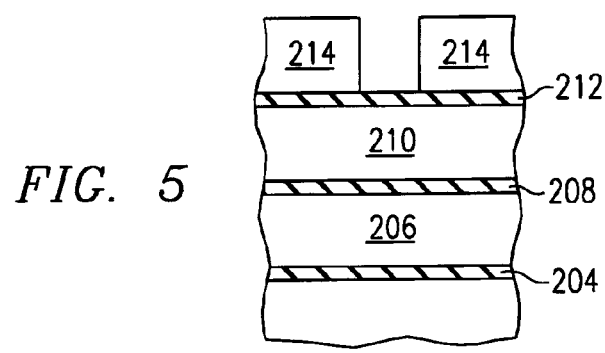
FIG. 5 is a cross-section diagram of a test structure.

A third embodiment of the invention is described in conjunction with FIGS. 4A–4B. Semiconductor body 100 is processed as in the first embodiment through the opening of the shelf layer shown in FIG. 2D. This approach is also a half-via first approach. After half the via 116 is etched (e.g., through the IMD 110) and the shelf layer 108 in via 116 is removed, the BARC layer 120 is deposited and the trench pattern 122 is formed, as shown in FIG. 4A. The hardmask 112 may be etched using a $Ar/CF_4/O_2/C_2H_4/N_2$ chemistry and the via 116 in SiLK™ IMD 110 may be etched using a $N_2/O_2/C_2H_4$ chemistry. A chemistry comprising $Ar/O_2$ may be used to open up the shelf layer 108.

Next, the trench 124 is etched in IMD 110. A $N_2/O_2/HC$ chemistry may be used. The BARC material 120 in via 116 at the beginning of this etch delays the etching of via 116 into ILD 106. Via 116 is still extended through ILD 106 by the end of this etch, as shown in FIG. 4B. However, the delay caused by BARC material 120 prevent punchthrough of the passivation layer 102 at the bottom of via 116. The desired barrier and copper material are then deposited and CMP'd to form second interconnect layer 126 as shown in FIG. 2K.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the following steps performed in order of:

forming an interlevel dielectric layer over a semiconductor body;

forming an intrametal dielectric layer over said interlevel dielectric layer;

forming a hardmask over said intrametal dielectric layer;

forming a via pattern over said hardmask;

selectively etching a via through said hardmask;

partially extending said via by selectively etching said intrametal dielectric layer;

depositing a BARC layer over said hardmask and within said via, wherein said BARC layer is significantly thicker within said via than over said hardmask;

forming a trench pattern over said BARC layer; and etching a trench in said intrametal dielectric layer, wherein said etching a trench step further removes at least a portion of said BARC layer within said via and removes a portion of said interlevel dielectric layer such that at the conclusion of said etching a trench step said via extends through said interlevel dielectric layer.

2. The method of claim 1, further comprising the step of filling said trench and via with copper.

3. The method of claim 1, wherein said intrametal dielectric layer comprises an organic polymer.

4. The method of claim 1, wherein said intrametal dielectric layer and said interlevel dielectric layer comprise SiLK™.

5. The method of claim 1, wherein said interlevel dielectric comprises an organic polymer.

6. A method of fabricating an integrated circuit, comprising the following steps performed in order:

forming an interlevel dielectric layer over a semiconductor body;

forming a shelf layer over said interlevel dielectric layer;

forming an intrametal dielectric layer over said shelf layer;

forming a hardmask over said intrametal dielectric layer;

forming a via pattern over said hardmask;

selectively etching a via through said hardmask;

partially extending said via by selectively etching said intrametal dielectric layer and said shelf layer, but not etching through said interlevel dielectric layer;

depositing a BARC layer over said hardmask and within said via after said extending said via step;

forming a trench pattern over said BARC layer; and etching a trench in said intrametal dielectric layer, wherein said etching a trench step further removes at least a portion of said BARC layer within said via and extends said via through said interlevel dielectric layer.

7. A method of fabricating an integrated circuit, comprising the following steps performed in order of:

forming an interlevel dielectric layer over a semiconductor body;

forming an intrametal dielectric layer over said interlevel dielectric layer;

forming a hardmask over said intrametal dielectric layer;

forming a via pattern over said hardmask;

selectively etching a via through said hardmask;

forming a half via by extending said via through said intrametal dielectric layer using selective etching;

depositing a BARC layer over said hardmask and within said via, wherein said BARC layer is significantly thicker within said via than over said hardmask;

forming a trench pattern over said BARC layer; and etching a trench in said intrametal dielectric layer, wherein said etching a trench step further removes at least a portion of said BARC layer within said via and removes a portion of said interlevel dielectric layer such that at the conclusion of said etching a trench step said via extends through said interlevel dielectric layer.

8. The method of claim 7, further comprising the steps of forming a shelf layer between: said interlevel dielectric layer and said intrametal dielectric layer, wherein said step of forming a half via further extends said via through said shelf layer.

* * * * *